(12) United States Patent
Suemasu et al.

(10) Patent No.: US 11,009,338 B2
(45) Date of Patent: May 18, 2021

(54) LIQUID DROPLET MEASUREMENT METHOD AND LIQUID DROPLET MEASUREMENT DEVICE, AND METHOD AND APPARATUS FOR MANUFACTURING DEVICE

(71) Applicant: Panasonic Intellectual Property Management Co., Ltd., Osaka (JP)

(72) Inventors: Satoshi Suemasu, Osaka (JP); Keijiro Masunaga, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 191 days.

(21) Appl. No.: 15/925,730

(22) Filed: Mar. 19, 2018

(65) Prior Publication Data

US 2018/0283856 A1   Oct. 4, 2018

(30) Foreign Application Priority Data

Apr. 4, 2017 (JP) .............................. JP2017-074097
Dec. 26, 2017 (JP) .............................. JP2017-249165

(51) Int. Cl.
*G01B 11/00* (2006.01)
*B41M 5/00* (2006.01)
(Continued)

(52) U.S. Cl.
CPC ............. *G01B 11/00* (2013.01); *B41M 3/003* (2013.01); *B41M 5/0047* (2013.01);
(Continued)

(58) Field of Classification Search
USPC ................................ 118/712, 713, 305, 500
See application file for complete search history.

(56) References Cited

U.S. PATENT DOCUMENTS

| 2003/0183330 A1* | 10/2003 | Iseki ..................... B32B 39/00 156/256 |
| 2009/0109413 A1* | 4/2009 | Shibazaki ........... G03F 7/70925 355/30 |
| 2010/0201976 A1* | 8/2010 | Kamiyama ....... H01L 21/67778 356/237.5 |

FOREIGN PATENT DOCUMENTS

| JP | 09080409 A | * | 3/1997 |
| JP | 2002252273 A | * | 9/2002 |

(Continued)

OTHER PUBLICATIONS

English Translation JP-2011179973A, Sep. 15, 2011. (Year: 2011).*
English Translation JP2002252273A, Sep. 6, 2002 (Year: 2002).*

*Primary Examiner* — Yewebdar T Tadesse
(74) *Attorney, Agent, or Firm* — Greenblum & Bernstein, P.L.C.

(57) ABSTRACT

A liquid droplet measurement method and a liquid droplet measurement device with which the luminance contrast can be improved without making changes in, for example, the numerical aperture of a lens when the quantity of reflected light from the surface of the measurement target liquid droplet alone cannot provide a sufficient luminance contrast. A method and an apparatus for manufacturing a device are also provided. The liquid droplet measurement device includes: a measurement table having a surface with a recess and for holding a translucent sample substrate; an imaging section that applies light onto the sample substrate having formed thereon a liquid droplet, and measures quantities of reflected light from the sample substrate and the liquid droplet; and a measurement control unit that determines a volume or a surface shape of the liquid droplet using luminance information of the reflected light quantities measured by the imaging section.

12 Claims, 9 Drawing Sheets

(51) Int. Cl.
*B41M 3/00* (2006.01)
*G01B 11/30* (2006.01)
*G06T 7/62* (2017.01)
*G01B 11/24* (2006.01)
*H01L 51/00* (2006.01)

(52) U.S. Cl.
CPC ............ B41M 5/0064 (2013.01); G01B 11/24 (2013.01); G01B 11/303 (2013.01); G06T 7/62 (2017.01); *G06T 2207/10024* (2013.01); *H01L 51/0005* (2013.01)

(56) References Cited

FOREIGN PATENT DOCUMENTS

JP       2011179973 A  *   9/2011
JP       2015-125125      7/2015

* cited by examiner

LIQUID DROPLET MEASUREMENT METHOD AND LIQUID DROPLET MEASUREMENT DEVICE, AND METHOD AND APPARATUS FOR MANUFACTURING DEVICE

TECHNICAL FIELD

The technical field relates to a liquid droplet measurement method, a liquid droplet measurement device, and to a method and an apparatus for manufacturing such a device.

BACKGROUND

A known example of a panel manufacturing method produces color filters of liquid crystal displays and devices such as organic EL displays. The panel manufacturing method ejects a functional material-containing fluid through a plurality of nozzles in the form of a liquid droplet using an inkjet method and forms a film of functional material on a print target.

Here, it is important to control and make the ejection amount of a liquid droplet constant by obtaining the correspondence between the settings of a control unit that controls the ejection amount of the liquid droplet, and the amount of the liquid droplet actually ejected. This is because unevenly ejected amounts of the liquid droplet cause thickness variation in the functional material, which leads to defective devices. For example, such thickness variation is perceived as an uneven color or uneven luminance in color filters and organic EL displays.

A method is known that checks the amount of the ink actually ejected through a nozzle. In this method, ink is ejected and applied to a substrate, and the volume or surface shape of a liquid droplet is found by calculating a slope at different locations on the ink droplet surface from brightness changes optically observed at these locations (JP-A-2015-125125).

In the method that calculates the volume or surface shape from the luminance information of a liquid droplet, the quantity of reflected light from the surface of the measurement target liquid droplet represents an important factor that determines the measurement accuracy.

However, the slope difference between the center and circumference portion of a liquid droplet becomes smaller as the measurement target liquid droplet becomes flatter. In this case, a sufficient contrast may not be obtained in the quantity of the reflected light at the liquid droplet surface. It may be possible to obtain contrast by making the numerical aperture (hereafter "NA") of the imaging lens smaller. However, with a smaller NA, the luminance obtained does not reflect the shape at the circumference portion of the liquid droplet, where the slope is large. That is, the surface reflection cannot provide a sufficient luminance contrast reflective of the slope when the measurement target liquid droplet has a flat shape.

SUMMARY

As a solution to the foregoing problem, the present disclosure is intended to provide a liquid droplet measurement method and a liquid droplet measurement device with which the luminance contrast can be improved without making changes in, for example, the NA of a lens when the quantity of reflected light from the surface of the measurement target liquid droplet alone cannot provide a sufficient luminance contrast. The disclosure is also intended to provide a method and an apparatus for manufacturing a device.

According to an aspect of the disclosure, a liquid droplet measurement device includes:

a measurement table having a surface with a recess and for holding a translucent sample substrate;

an imaging section that applies light onto the sample substrate having formed thereon a liquid droplet, and measures quantities of reflected light from the sample substrate and the liquid droplet; and a measurement control unit that determines a volume or a surface shape of the liquid droplet using luminance information of the reflected light quantities measured by the imaging section, the sample substrate having a thickness larger than a wavelength of the light, and equal to or smaller than a focal length of the liquid droplet.

According to another aspect of the disclosure, an apparatus for manufacturing a device includes:

the liquid droplet measurement device;

a work table for holding a print target; and a line head for applying a liquid droplet to the print target.

According to yet another aspect of the disclosure, a method for measuring a liquid droplet includes:

setting a translucent sample substrate having formed thereon a measurement target liquid droplet on a measurement table having a surface with a recess, the sample substrate being set on the measurement table in such an orientation that the side on the back of the liquid droplet corresponds in position to the recess;

applying light to the liquid droplet formed on the sample substrate set on the measurement table, imaging the liquid droplet with an imaging section, and measuring quantities of reflected light from the sample substrate and the liquid droplet with the sample substrate having a thickness larger than a wavelength of the light, and equal to or smaller than a focal length of the liquid droplet; and determining a volume or a surface shape of the liquid droplet using the reflected light quantities measured by the imaging section.

According to still another aspect of the disclosure, a method for manufacturing a device includes the following steps that are performed before or after the liquid droplet measurement method:

setting a print target on the measurement table; and ejecting the functional material onto the print target through the head having a nozzle of interest for evaluation to produce the print target.

With the foregoing configurations, the light that passes through the liquid droplet and is reflected at the back surface of the sample substrate converges near the liquid droplet by the phenomenon in which the liquid droplet behaves as a lens. In addition, the reflected light from the surface of the measurement target liquid droplet is brighter toward the center. This creates a luminance distribution that is brighter toward the center of the liquid droplet.

That is, the light reflected at the surface of the liquid droplet, and the light that passes through the liquid droplet, and is reflected at the back surface of the sample substrate create a luminance distribution that is brighter toward the center of the liquid droplet. This makes it possible to provide a higher luminance contrast than when imaging only the reflected light from the surface of the liquid droplet.

This makes it easier to associate luminance information with slope information in imaging the liquid droplet, and the volume or surface shape can be determined both quickly and accurately from the luminance information of the liquid droplet. This makes it possible to measure the volume or shape of the liquid droplet in a shorter time period, and to improve measurement accuracy.

DESCRIPTION OF EMBODIMENTS

Embodiments of a liquid droplet measurement method of the present disclosure are described below.

First Embodiment

Figure 1:
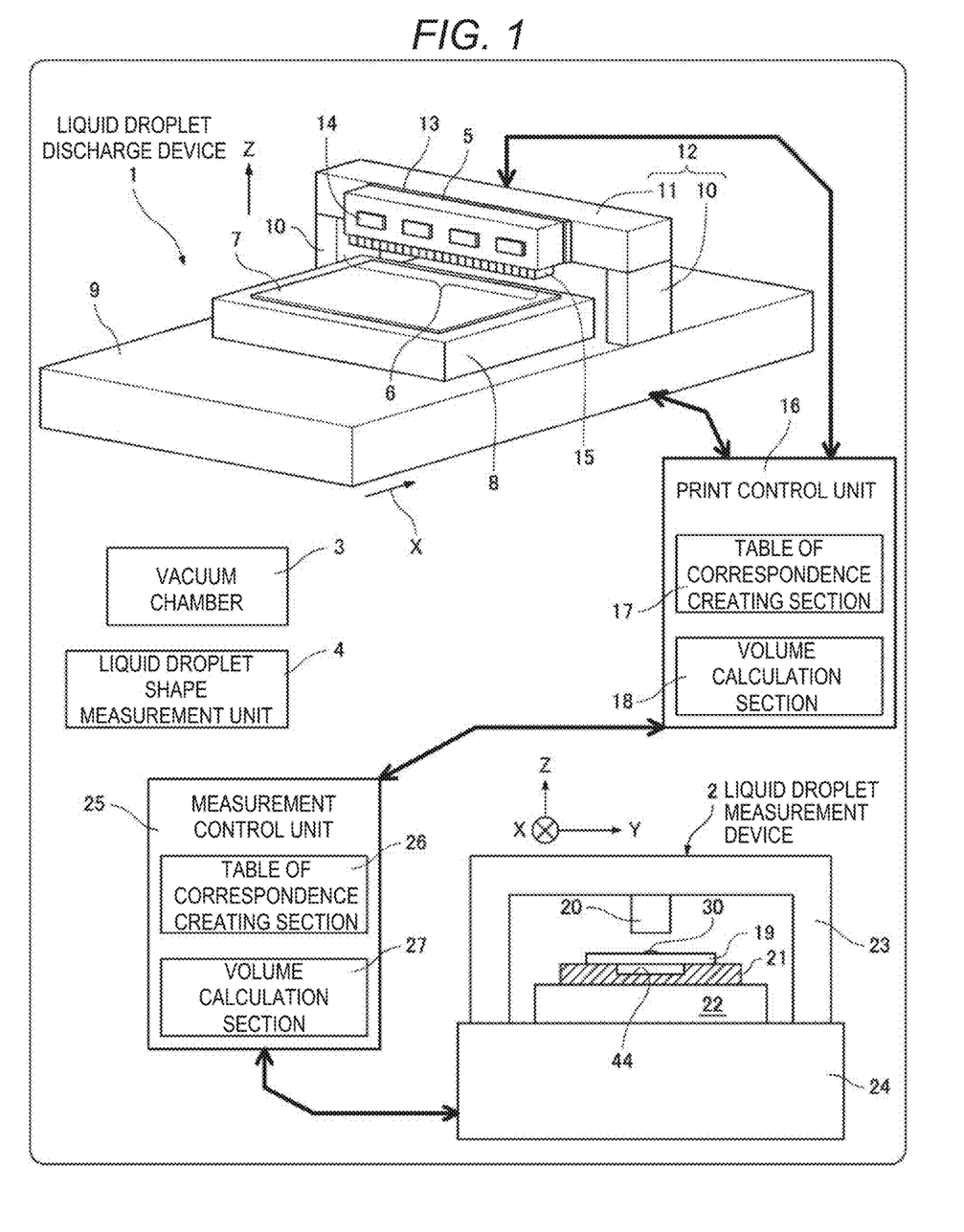
FIG. 1 shows a block diagram of a panel manufacturing apparatus that includes a liquid droplet, discharge device that ejects and applies a functional material ink to a print target, and a liquid droplet measurement device that pre-measures a liquid droplet so that the ink is ejected in an amount closer to the target value.

FIG. 1 snows a panel manufacturing apparatus that includes a liquid droplet measurement device used to implement the liquid droplet measurement method of an embodiment of the present disclosure. The panel manufacturing apparatus is configured from a liquid droplet discharge device 1, a liquid droplet measurement device 2, a vacuum chamber 3, and a liquid droplet shape measurement unit 4.

The vacuum chamber 3 is used to dry the applied liquid droplet. The liquid droplet measurement device 2 determines the volume or surface shape of a liquid droplet 30 in a snort time period using the luminance information obtained by imaging the liquid droplet 30 ejected onto a sample substrate 19 with the liquid droplet discharge device 1. The result is fed back to the liquid droplet discharge device 1 to bring the subsequent liquid droplet ejection operation closer to the desired state.

The liquid droplet shape measurement unit 4, provided separately from the liquid droplet measurement device 2, is a device used to create a table of correspondence relating a liquid droplet shape to the luminance information determined by the liquid droplet measurement device 2.

In the embodiment, the liquid droplet shape measurement unit 4 is a measurement instrument that takes advantage of optical interference.

The liquid droplet shape measurement unit 4 may be installed on the liquid droplet discharge device 1, on the liquid droplet measurement device 2, or by itself.

Liquid Droplet Discharge Device 1

The liquid droplet discharge device 1 produces color filters of liquid crystal displays, and devices such as organic EL displays. To produce a panel, the liquid droplet discharge device 1 ejects a functional material-containing fluid in droplets through the line head 6 of its head unit 5 onto a print target 7, using an inkjet method.

The print target 7 is set on a work table 8 that is disposed vertically beneath the head unit 5. The work table 8 is attached to a stage 9 having a drive system and transported in the X direction. On the stage 9 are provided a pair of columns 10, and a support unit 11 attached to the top of the columns 10. The pair of columns 10, and the support unit 11 form a gated gantry 12.

A support base 13 having an elevation axis in the vertical direction (Z-axis direction; see FIG. 1) is joined to the front of the gantry 12 so as to be movable in the vertical direction. The head unit 5 is disposed on the support base 13.

The head unit 5 has distribution tanks 14, and the line head 6. The head unit 5 adjusts the gap between the print target 7 and the line head 6 by moving up and down in the vertical direction Z.

The line head 6 includes a plurality of liquid droplet ejection module heads 15 having a plurality of nozzles (not illustrated) for ejecting ink, and a piezoelectric actuator (not illustrated) corresponding to each nozzle.

A print control unit 16 supplies power and a head control signal for controlling each head to each liquid droplet ejection module head 15. The print control unit 16 also supplies a control signal to X- and Z-drive shafts. The print control unit 16 may include a table of correspondence creating section 17, and a volume calculation section 18, which will be described later.

As described above, the line head 6 has the liquid droplet ejection module heads 15 arranged over the whole width of the print target 7. During print operation, a liquid droplet is ejected through the line head 6 at a predetermined timing under the control signal from the print control unit 16, and the line head 6 can form the desired image over the whole width of the print target 7 as the print target 7 is moved in the X direction.

Sample Substrate 19

The sample substrate 19 is a substrate measured by the liquid droplet measurement device 2. The sample substrate 19 is set in the liquid droplet discharge device 1, and the line head 6 applies a functional material. The sample substrate 19 is translucent, and a transparent material such as glass is used in this embodiment.

The sample substrate 19 may be the print target 7 used directly after the application of the desired functional material or may be a divided portion of the print target 7. The present embodiment is based on an example in which the sample substrate 19 is a divided portion of the print target 7. The print target 7 is a product such as a display panel.

The sample substrate 19 is set on a measurement table 21 disposed vertically underneath an imaging section 20.

Liquid Droplet Measurement Device 2

Desirably, the sample substrate 19 in the liquid droplet measurement device 2 is transported by automation, for example, by a robot. However, manual transport is also possible. In this embodiment, a series of processes that produces the sample substrate 19 by dividing the print target 7 produced in the liquid droplet discharge device 1 is carried out by automation using a robot, and the divided sample substrate 19 is manually transported, and set in the liquid droplet measurement device 2.

The measurement table 21, where the sample substrate 19 is set, is transported in the X direction with a stage 22 having a drive system. A gated gantry 23 is fixed on the stage 22. Desirably, the gantry 23 is a mechanism having a drive system, capable of moving the imaging section 20 in Y and Z directions.

Instead of using the mechanism that transports the stage 22 in the X direction, the imaging section 20 may be transported in the X direction with a mechanism that does not move the stage 22. The moving range of the liquid droplet measurement device 2 can be made smaller with this configuration.

The liquid droplet measurement device 2 has a cradle 24 on which the stage 22 having a drive system is mounted. Desirably, the cradle 24 uses a vibration absorbing table to isolate itself from external vibration. The vibration absorbing table may be an active vibration absorbing table that actively acts on vibration, or a passive vibration absorbing table that passively acts on vibration.

The liquid droplet measurement device 2 has a measurement control unit 25. The measurement control unit 25 supplies a control signal to the X-, Y-, and Z-drive shafts, and to the imaging section 20 used to measure a liquid droplet. The measurement control unit 25 may include a table of correspondence creating section 26, and a volume calculation section 27.

Desirably, the measurement control unit 25 is connected via, for example, a network, to the print control unit 16 installed in the liquid droplet discharge device 1. The measurement control unit 25 is also desirably a mechanism that enables transfer of the image created by the imaging section 20, and transfer of data such as the volume or surface shape of a liquid droplet calculated using the image.

With such a configuration, for example, a drive voltage of when ejecting ink in the liquid droplet discharge device 1 can be supplied to each liquid droplet ejection module head 15 using the liquid droplet volume found in the measurement control unit 25 of the liquid droplet measurement device 2, together with power and a head control signal for controlling each head.

The imaging section 20 will be described later in further detail with reference to FIG. 5.

Liquid Droplet Measurement System

Figure 2:
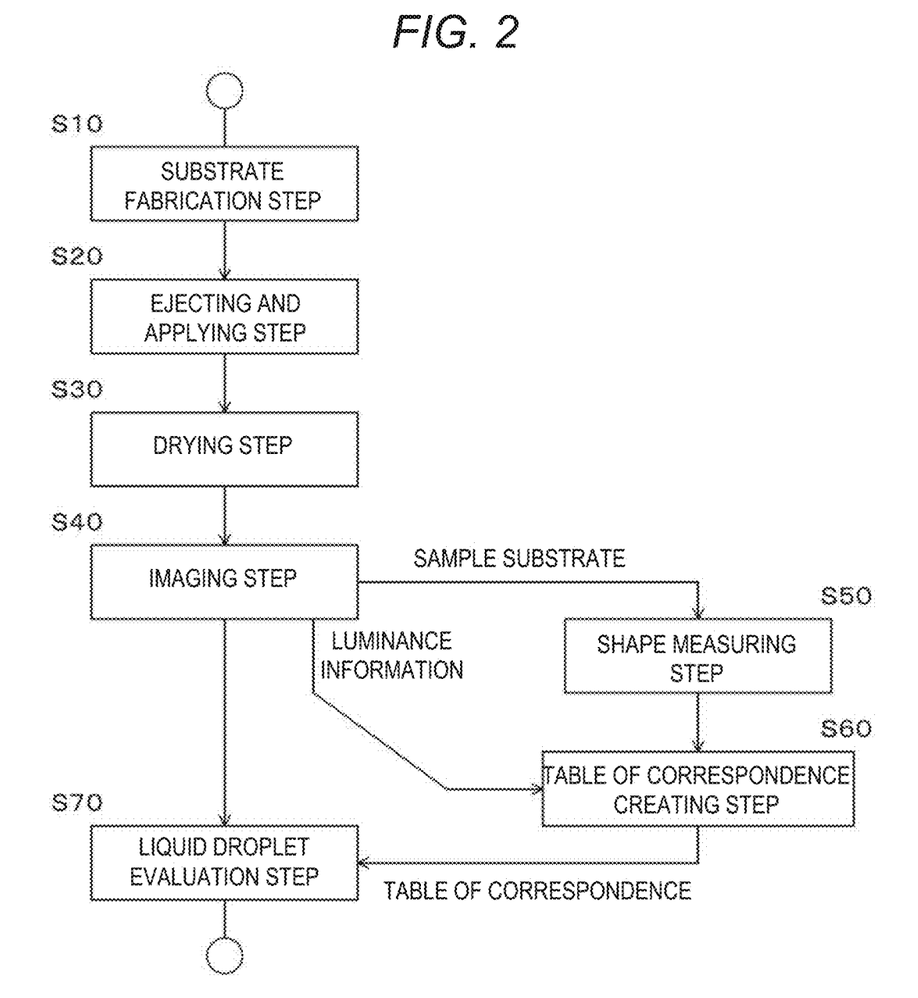
FIG. 2 is a diagram representing the overall procedure of the liquid droplet measurement device of an embodiment.

The following describes a liquid droplet measurement system used to implement the liquid droplet measurement method of the embodiment of the present disclosure, with reference to FIG. 2.

The liquid droplet measurement method of the embodiment includes:

a substrate fabrication step S10 performed as a preparatory process using, for example, a spin coating or a die coating machine;

an ejecting and applying step S20 performed with the liquid droplet discharge device 1;

a drying step S30 performed with the liquid droplet discharge device 1 and the vacuum chamber 3;

an imaging step S40 performed with the liquid droplet measurement device 2;

a shape measuring step S50 performed with the liquid droplet shape measurement unit 4;

a table of correspondence creating step S60 performed with the print control unit 16 or the measurement control unit 25; and a liquid droplet evaluation step S70 performed with the print control unit 16 or the measurement control unit 25.

Substrate Fabrication Step S10

Figure 3:
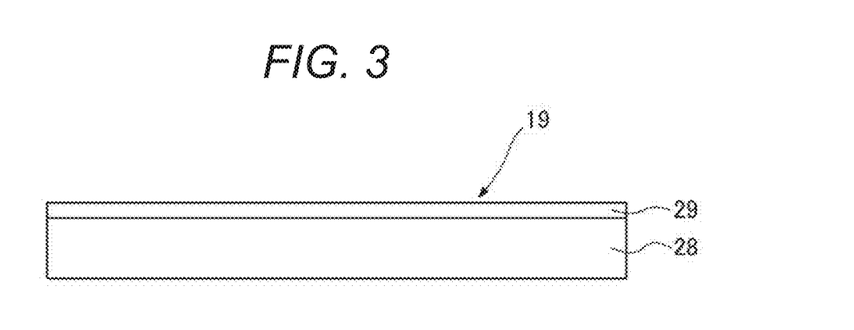
FIG. 3 is an enlarged cross sectional view of a sample substrate.

The following describes the substrate fabrication step S10, which is a preparatory process performed with, for example, a spin coating or a die coating machine, with reference to FIG. 3.

The sample substrate 19 is configured from a support substrate 28, and a polymer film 29.

The support substrate 28 may be, for example, glass. The polymer film 29 is a film formed by dissolving in an organic solvent a resist material, applying the resist material solution to the support substrate 28, and then dried. The resist material is used to form, for example, a light-emitting layer of an organic EL display. The application of the resist material solution can be by spin coating or die coating. The material of the polymer film 29 is a polyimide or acrylic-resin photosensitive material. The photosensitive material may contain fluorine. Typically, a fluorine-containing resin material is not particularly limited, as long as it is highly transparent, and has a fluorine atom in at least some of the polymer repeating units. Examples of such fluorine compound-containing resins include a fluorinated polyolefinic resin, a fluorinated polyimide resin, and a fluorinated polyacrylic resin. The resin thickness is typically 0.1 to 3 µm, particularly preferably 0.8 to 1.2 µm. The following description of polymer film 29 is based on an example using a polyimide or acrylic-resin photosensitive material.

The polymer film 29 is rendered water repellent when the material is a fluorine-containing polymer material.

Here, the water repellency may be too high with the fluorine film formed on the surface, and the desired contact angle may not be obtained upon applying and drying the ink. In this case, the water repellency of the sample substrate 19 can be controlled by applying UV (ultraviolet) light to the polymer film 29 of the sample substrate 19, and partially cutting the fluorine bond.

Ejecting and Applying Step S20

The following describes the ejecting and applying step S20 performed in the liquid droplet discharge device 1, specifically, the step of forming a liquid droplet on the sample substrate 19 by ejecting a functional material-containing fluid through the line head 6 having a plurality of nozzles of interest for evaluation.

Figure 4:
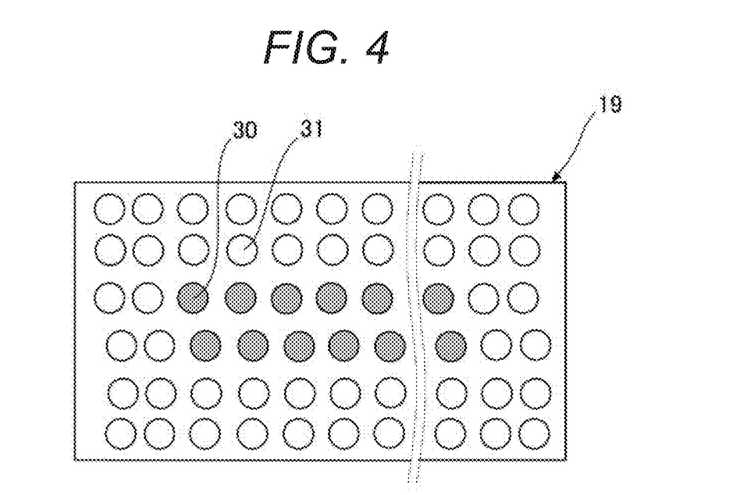
FIG. 4 is an enlarged plan view of a sample substrate having formed thereon a measurement target liquid droplet.

FIG. 4 shows the sample substrate 19, and a pattern of liquid droplets applied and formed on the sample substrate 19.

On the sample substrate 19 are formed liquid droplets 30, and dummy liquid droplets 31 for maintaining the atmosphere of when drying a liquid droplet sample used for volume measurement constant.

The dummy liquid droplet 31 serves to maintain the solvent atmosphere of the liquid droplet 30 constant during drying and keeps the contact angle α of the liquid droplet 30 within a certain range.

The number of dummy liquid droplets 31 varies with the solvent used for the ink. For example, when the ink solvent is anisole, it is desirable to surround the liquid droplet 30 with 1 to 10 layers of dummy liquid droplets. In the present embodiment, two layers of dummy liquid droplets 31 are placed around the liquid droplet 30.

Drying Step S30

In the drying step S30, the drying conditions depend on the properties of the solvent used for the ink. For example, when the solvent is anisole, the ink is dried in a temperature range of 23° C. to 60° C. in a reduced pressure atmosphere.

Preferably, for example, the ink is dried with the vacuum chamber 3 in a reduced pressure atmosphere at the desired timing after being naturally dried under the atmospheric pressure on the work table 8 for a predetermined time period, according to the properties of the solvent used for the ink. With such a configuration, the shape of the liquid droplet 30 can be controlled as desired.

Imaging Step S40

In the imaging step S40, the imaging section 20 images the liquid droplet 30 created in the drying step S30.

Figure 5:
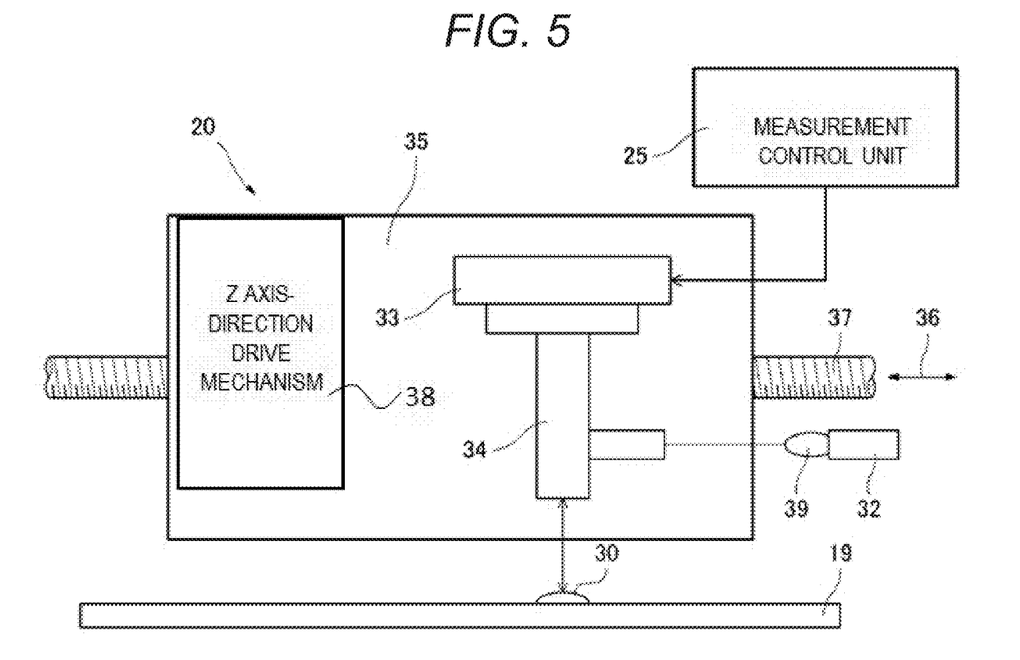
FIG. 5 shows a block diagram of an imaging section.

The overall configuration of the imaging section 20 is shown in FIG. 5. The imaging section 20 has a light source 32, a camera 33, a lens 34, a jig 35 holding the camera 33 and the lens 34, a drive mechanism 37 for driving these components in the X direction along a scan axis 36, and a Z-direction drive mechanism 38 provided for focusing.

The camera 33 and the lens 34 move along the direction of scan axis 36 and create an image of the liquid droplet 30 applied to the sample substrate 19. The image data of the liquid droplet sample is sent to the table of correspondence creating section 26 and the volume calculation section 27 provided in the measurement control unit 25.

The camera 33 may be equipped with an area sensor or a line sensor. The present embodiment uses a camera equipped with a line sensor. The number of pixels, and the pixel size may be selected according to the imaging subject. In the present embodiment, the number of pixels is 4,096 in the width direction, and the pixel size is 2 μm. The magnification and the NA of the lens 34 are selected according to the shape of the liquid droplet to be imaged. The present embodiment uses a lens with a magnification of 5 times, and an NA of about 0.1.

Desirably, a telecentric lens is used for the lens 34 to make the influence of focusing relatively smaller. In order to avoid the influence of optical tilt, it is desirable to use a coaxial episcopic lens for illumination.

Light Path in Imaging Step S40

Figure 6:
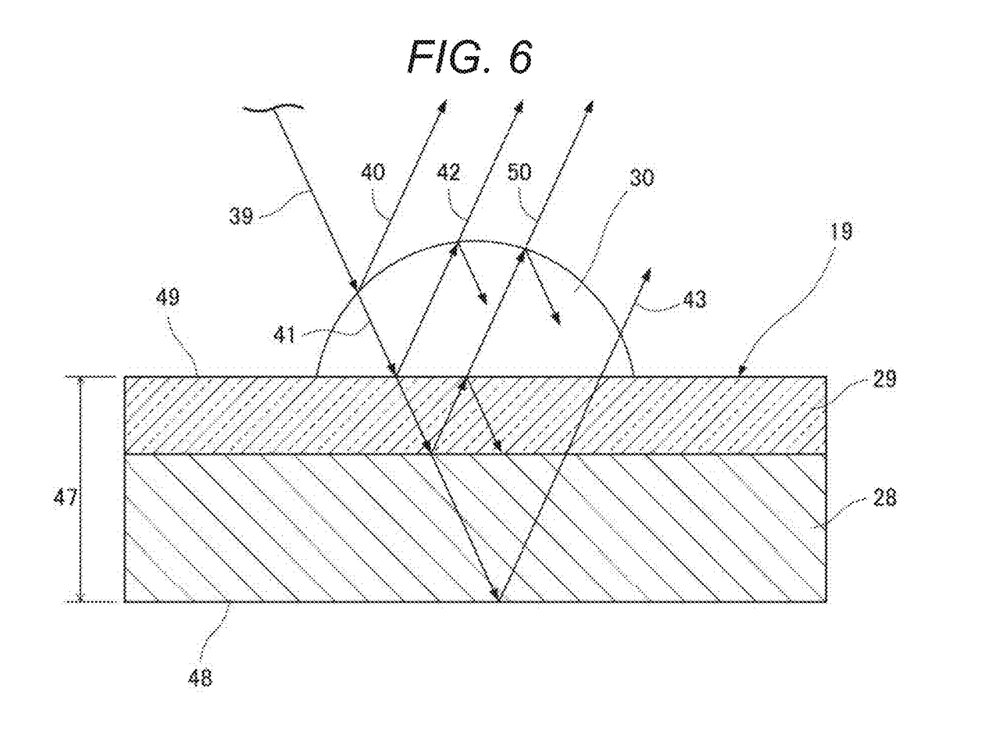
FIG. 6 is an explanatory diagram showing paths of the light imaging a liquid droplet.

FIG. 6 shows the light path of when imaging the liquid droplet 30 ejected onto the sample substrate 19 from the line head 6. The arrows in FIG. 6 conceptually represent the light path, and do not necessarily represent the actual paths of traveling light.

A parallel ray of light 39 from the light source 32 splits into a ray of light 40 reflected at the surface of the liquid droplet 30, and a ray of light 41 that is refracted into the liquid droplet. In the present embodiment, the ray of light 42 reflected at the interface between the liquid droplet 30 and the polymer film 29, and the ray of light 50 reflected at the interface between the polymer film 29 and the support substrate 28 are ignored because the quantities of these rays of light become considerably smaller than the quantities of the rays of light 40 and 41 by reducing the refractive index difference between the liquid droplet 30, and the polymer film 29 and the support substrate 28.

The ray of light 40 reflected at the surface of the liquid droplet 30 has a correlation with the slope of the liquid droplet 30, and the shape of the liquid droplet 30 can be calculated from the quantity of this light. Specifically, the ray of light 40 reflected at the surface of the liquid droplet 30 tends to be brighter toward the center of the liquid droplet 30 where the slope is smaller, and darker toward the circumference portion of the liquid droplet 30 where the slope is larger.

However, the slope angle difference between the central portion and the circumference portion of the liquid droplet becomes smaller as the shape of the liquid droplet 30 becomes flatter, and a sufficient contrast may not be obtained in the quantity of the light reflected at the liquid droplet surface. One way to provide a sufficient contrast is to make the NA of the imaging lens smaller. However, with a smaller NA, the luminance obtained does not reflect the shape at the circumference portion of the liquid droplet, where the slope is large. That is, a sufficient luminance contrast that is reflective of the slope cannot be obtained from surface reflection when the measurement target liquid droplet has a flat shape.

Figure 7:
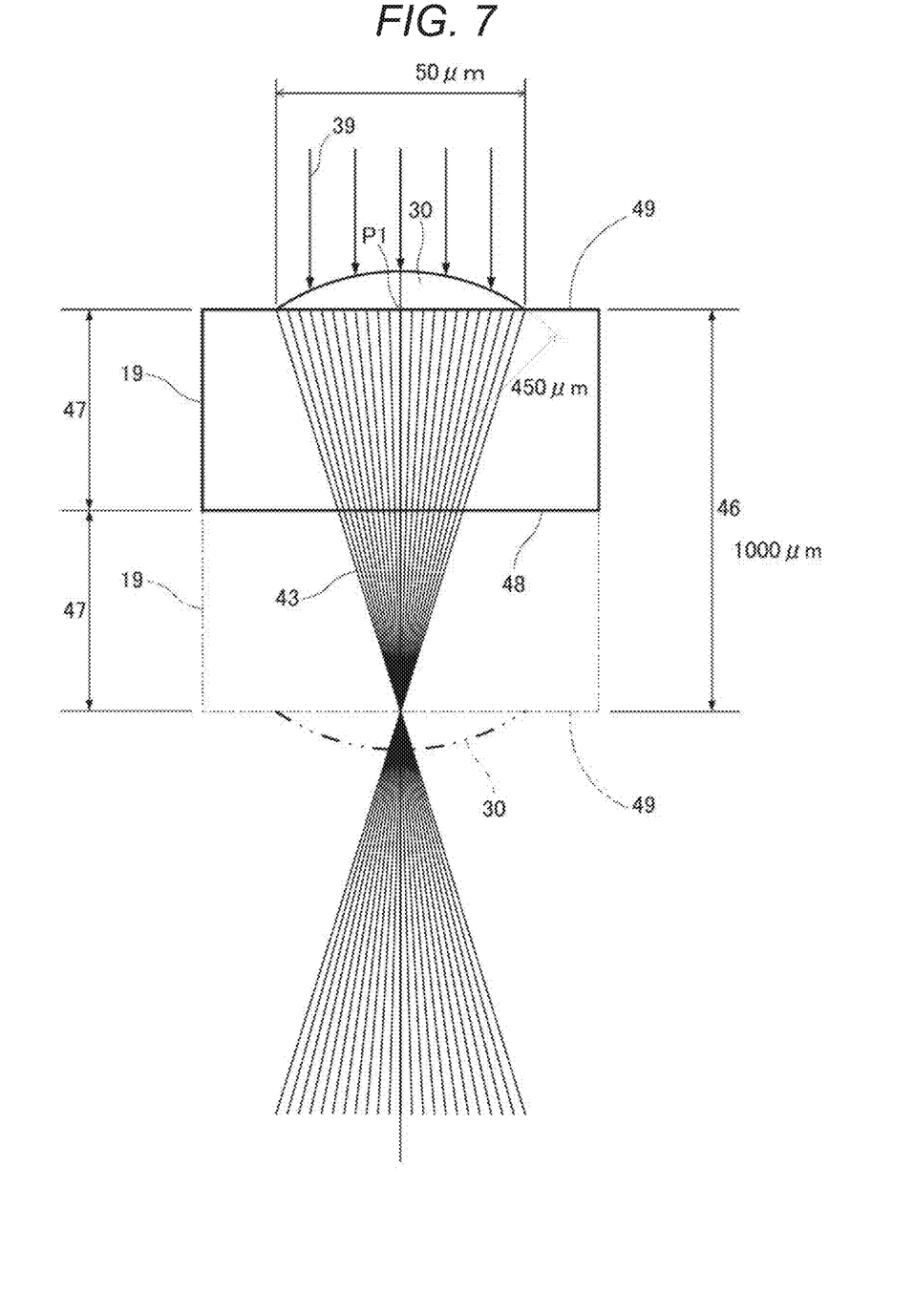
FIG. 7 is a diagram representing the result of a simulation of how the light behaves with a liquid droplet that is assumed to be an ideal lens.
Figure 8:
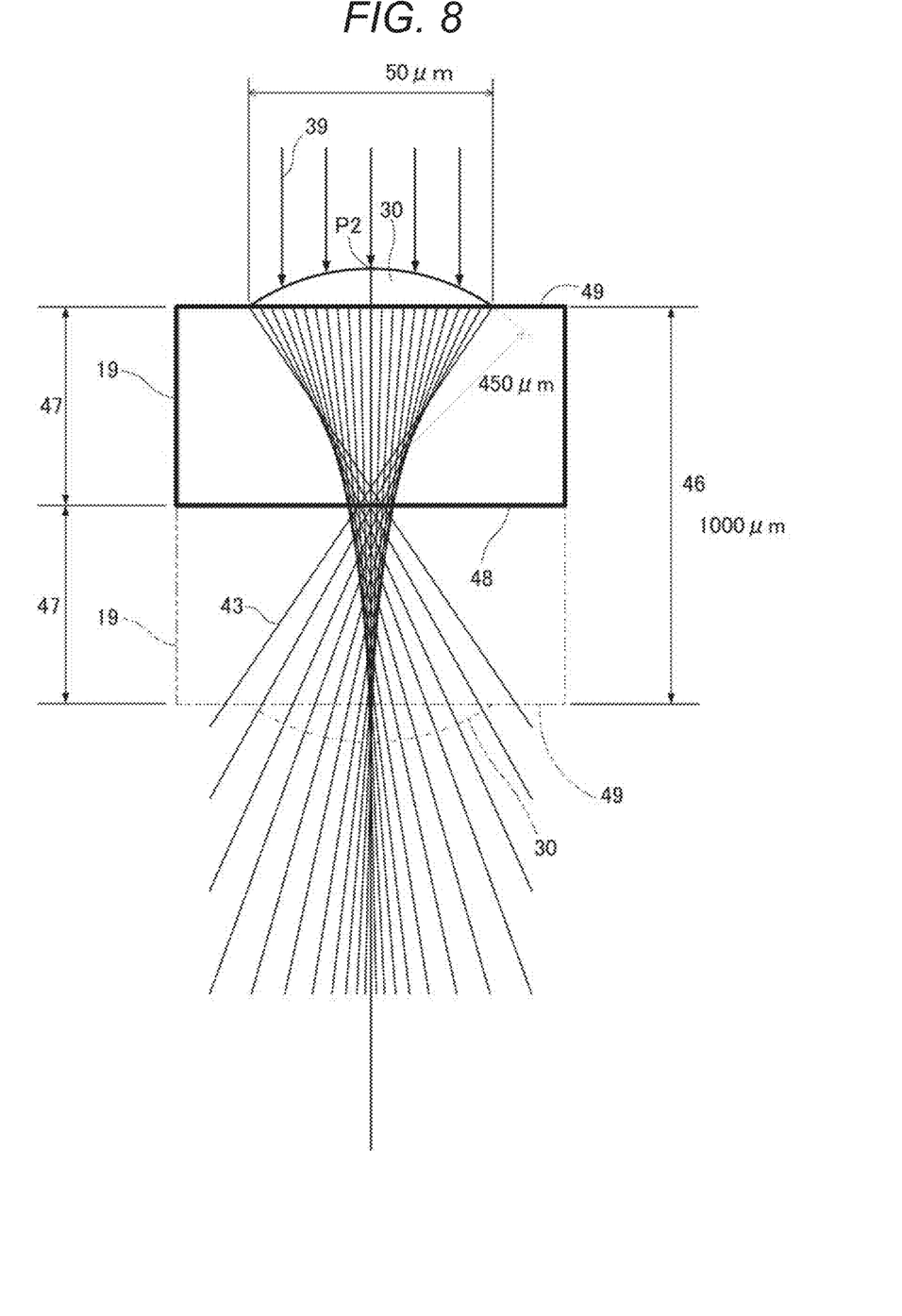
FIG. 8 is a diagram representing the result of a simulation of how the transmitted light behaves in a model liquid droplet shape.

The following describes a configuration with which a higher luminance contrast can be obtained when the ray of light 40 reflected at the surface of the liquid droplet 30 cannot provide a sufficient contrast alone, with reference to FIGS. 7 and 8.

FIG. 7 shows the result of a simulation conducted by assuming that the liquid droplet 30 is an ideal lens. Light 43 represents the path of the light 39 emerging from the light source 32, and reflecting at the back surface 48 of the sample substrate 19 through the liquid droplet 30.

It is assumed here that the light 43 undergoes regular reflection at the back surface 48 of the sample substrate 19, and, for clarity, the path of the light 43 after regular reflection is expanded on the lower side of the diagram. In this simulation, the liquid droplet has a diameter of 50 μm, and a curvature radius of 450 μm. In this case, the focal length 46 is about 1,000 μm.

When the thickness 47 of the sample substrate 19 is half the focal length 46 as shown in FIG. 7, the light 43 reflected at the back surface 48 of the sample substrate 19 converges at the point P1 on the surface 49 of the sample substrate 19. Because the lens 34 of the imaging section 20 has the focal point near the surface 49 of the sample substrate 19, a luminance distribution with a locally brighter luminance near the center of the liquid droplet 30 is added to the luminance distribution created by the surface reflection of the liquid droplet 30. This produces a higher luminance contrast than that produced solely by the luminance distribution of the light 40 reflected at the surface of the liquid droplet 30.

When the thickness 47 of the sample substrate 19 is larger than half of the focal length 46, the distance from the convergence point of the light 43 reflected at the back surface 48 of the sample substrate 19 to the surface 49 of the sample substrate 19 increases, and the light 43 reflected at the back surface 48 of the sample substrate 19 loses its contrast as the thickness 47 increases. When the thickness 47 of the sample substrate 19 takes the same value as the focal length 46, the light 43 reflected at the back surface 48 of the sample substrate 19 produces a uniform image within a plane.

When the thickness 47 of the sample substrate 19 is larger than the focal length 46, the light 43 reflected at the back surface 48 of the sample substrate 19 diffuses and produces a uniform image within a plane.

The distance from the convergence point of the light 43 reflected at the back surface 48 of the sample substrate 19 to the surface 49 of the sample substrate 19 also increases when the thickness 47 of the sample substrate 19 is smaller than half of the focal length 46, and the light 43 reflected at the back surface 48 of the sample substrate 19 loses its contrast as the thickness 47 decreases. With the thickness 47 of the sample substrate 19 approaching zero, the light 43 reflected at the back surface 48 of the sample substrate 19 produces a uniform image within a plane.

When the thickness 47 of the sample substrate 19 is shorter than the wavelength of light 39, it is desirable to make the thickness 47 of the sample substrate 19 larger than the wavelength of light 39 because, in this case, the light 39 passes through the back surface 48 of the sample substrate 19 instead of being reflected.

The light 43 reflected at the back surface 48 of the sample substrate 19 can thus produce a distribution in which the luminance is higher toward the center of the liquid droplet 30 than toward the circumference portion when the thickness 47 of the sample substrate 19 is larger than the wavelength of light 39 and is the same or smaller than the focal length 46 of the liquid droplet 30.

That is, the luminance distribution represented by the sum of the light 40 and the light 43 can have a higher luminance contrast than the luminance distribution produced solely by the light 40 reflected at the surface of the liquid droplet 30. A particularly high luminance contrast can be obtained when the thickness 47 is about half as long as the focal length 46. With the high luminance contrast obtained under these conditions, the shape of the liquid droplet can be more accurately evaluated in the liquid droplet evaluation step S70 described below.

Actual Conditions

In practice, the liquid droplet 30 is not an ideal lens, and the light 43 does not converge at one point. Nonetheless, the liquid droplet 30 behaves in a manner similar to an ideal lens, as shown in FIG. 8. FIG. 8 represents a model created from the actual shape of the liquid droplet 30 using a quartic function and shows the result of a simulation of the paths of the light passing through the liquid droplet 30. As in FIG. 7, it is assumed that the light 43 undergoes regular reflection at the back surface 48 of the sample substrate 19, and, for clarity, the path of the light 43 after regular reflection is expanded on the lower side of the diagram.

Here, the focal length 46 is a distance at which the incident parallel light on the convex side of the liquid droplet 30 converges the most in a small range having the center at the apex P2 of the liquid droplet 30. The small range is the pixel size of the imaging section derived from the sensor size of the camera, and the magnification of the lens 34 in the imaging section 20.

Under these conditions, the light 43 reflected at the back surface 48 of the sample substrate 19 produces a distribution in which the luminance is higher toward the center of the liquid droplet 30 than toward the circumference portion when the thickness 47 of the sample substrate 19 is larger than the wavelength of light 39 and is the same or smaller than the focal length 46 of the liquid droplet 30.

That is, the luminance distribution represented by the sum of the light 40 and the light 43 can have a higher luminance contrast than the luminance distribution produced solely by the light 40 reflected at the surface of the liquid droplet 30.

When the focal length of the liquid droplet shape is unknown, it is desirable to experimentally derive the focal length using the imaging section 20.

Factors Other Than Thickness of Sample Substrate 19

The thickness of the sample substrate 19 may be made variable by a structure in which a translucent dummy substrate is installed between the sample substrate 19 and the measurement table 21 via a medium such as a refractive index liquid. With such a configuration, the sample substrate 19 can be adjusted to any thickness according to the shape of the liquid droplet 30. Only one dummy substrate may be provided to simplify the configuration. However, when more than one dummy substrate is provided, the dummy substrates have different thicknesses.

Instead of varying the thickness of the sample substrate 19, ultraviolet light may be applied to the polymer film 29 on the sample substrate 19 to control the water repellency of the sample substrate 19, and to thereby make the shape of liquid droplet variable. With such a configuration, the liquid droplet 30 can be adjusted to any shape according to the thickness of the sample substrate 19.

Instead of varying the thickness of the sample substrate 19, the shape of liquid droplet may be made variable by controlling the natural drying conditions, and the reduced-pressure drying conditions of the ejected liquid droplet 30. With such a configuration, the liquid droplet 30 also can be adjusted to any shape according to the thickness of the sample substrate 19.

Material of Sample Substrate 19

It is desirable that the light 40 reflected at the surface of the liquid droplet 30, and the light 43 reflected at the back surface 48 of the sample substrate 19 have the same light quantity. In this way, the luminance distribution represented by the sum of the light 40 and the light 43 can have the highest luminance contrast when the light 40 reflected at the surface of the liquid droplet 30, and the light 43 reflected at the back surface 48 of the sample substrate 19 produce a distribution in which the luminance is higher toward the center of the liquid droplet than toward the circumference portion.

In order to provide the same light quantity for the light 40 reflected at the surface of the liquid droplet 30, and for the light 43 reflected at the back surface 48 of the sample substrate 19, it is required that the liquid droplet 30 and the sample substrate 19 have the same refractive index, and that the medium contacting the surface of the liquid droplet 30, and the medium contacting the back surface 48 of the sample substrate 19 have the same refractive index.

The refractive index of the liquid droplet 30 is determined by the type of ejected material and is uncontrollable. The resin material ejected under the inkjet scheme has a refractive index of typically about 1.4 to 1.6. It is accordingly desirable that the sample substrate 19 have a refractive index N of about $1.4 \le N \le 1.6$.

To this end, it is desirable to use, for example, glass for the sample substrate 19. In the present embodiment, the sample substrate 19 is a transparent glass having a refractive index of 1.5. Other materials, for example, such as a resin film, may be used, provided that it has the same or similar refractive index. In this way, the sample substrate 19 can be stored in the form of, for example, a web, and the storage space can be saved.

When the liquid droplet 30 and the sample substrate 19 have the same or similar refractive indices, the light 42 reflected off the boundary between the liquid droplet 30 and the sample substrate 19 is sufficiently smaller than the light 40 reflected at the surface of the liquid droplet 30 and is negligible. In the present embodiment, the liquid droplet 30 has a refractive index of 1.6, and the sample substrate 19 has a refractive index of 1.5.

As described above, the medium that contacts the surface of the liquid droplet 30, and the medium that contacts the back surface of the sample substrate 19 need to have the same refractive index. That is, the same medium needs to be used for these media. In the present embodiment, the medium is air.

Recess 44

Figure 9:
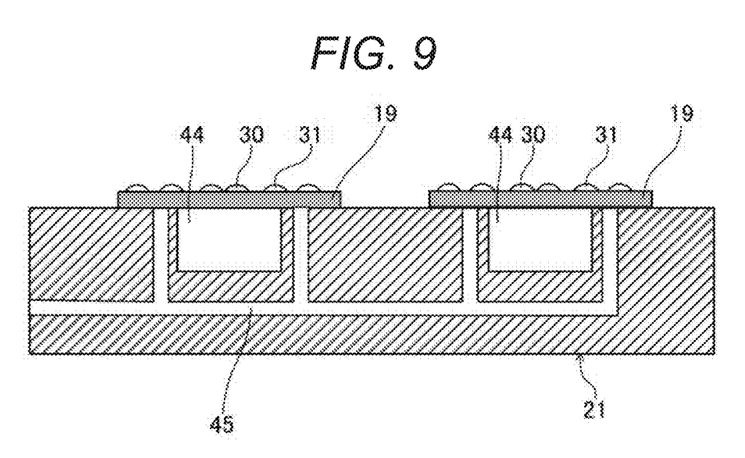
FIG. 9 is a cross sectional view of a measurement table on which the sample substrate is set.

In the present embodiment, the measurement table 21 is configured to have a recess 44 in the top surface as shown in FIG. 9, so that air becomes evenly available as the medium contacting the back surface of the sample substrate 19. Specifically, as shown in FIG. 9, the recess 44 is formed in the measurement table 21 in such a manner that the back surface of the sample substrate 19 does not contact the top surface of the measurement table 21 in portions corresponding to the liquid droplets 30 formed on the sample substrate 19.

Separately from the recess 44, inside the measurement table 21 is also provided a suction channel 45 that opens to the top surface of the measurement table 21. The sample substrate 19 set on the measurement table 21 is held by being sucked onto the top surface of the measurement table 21 through the suction channel 45.

With such a configuration, air can be used for both the medium contacting the surface of the liquid droplet 30 and the medium contacting the back surface of the sample substrate 19, and thus can have the same refractive index.

Shape Measuring Step S50, Table of Correspondence Creating Step S60, and Liquid Droplet Evaluation Step S70

Figure 10:
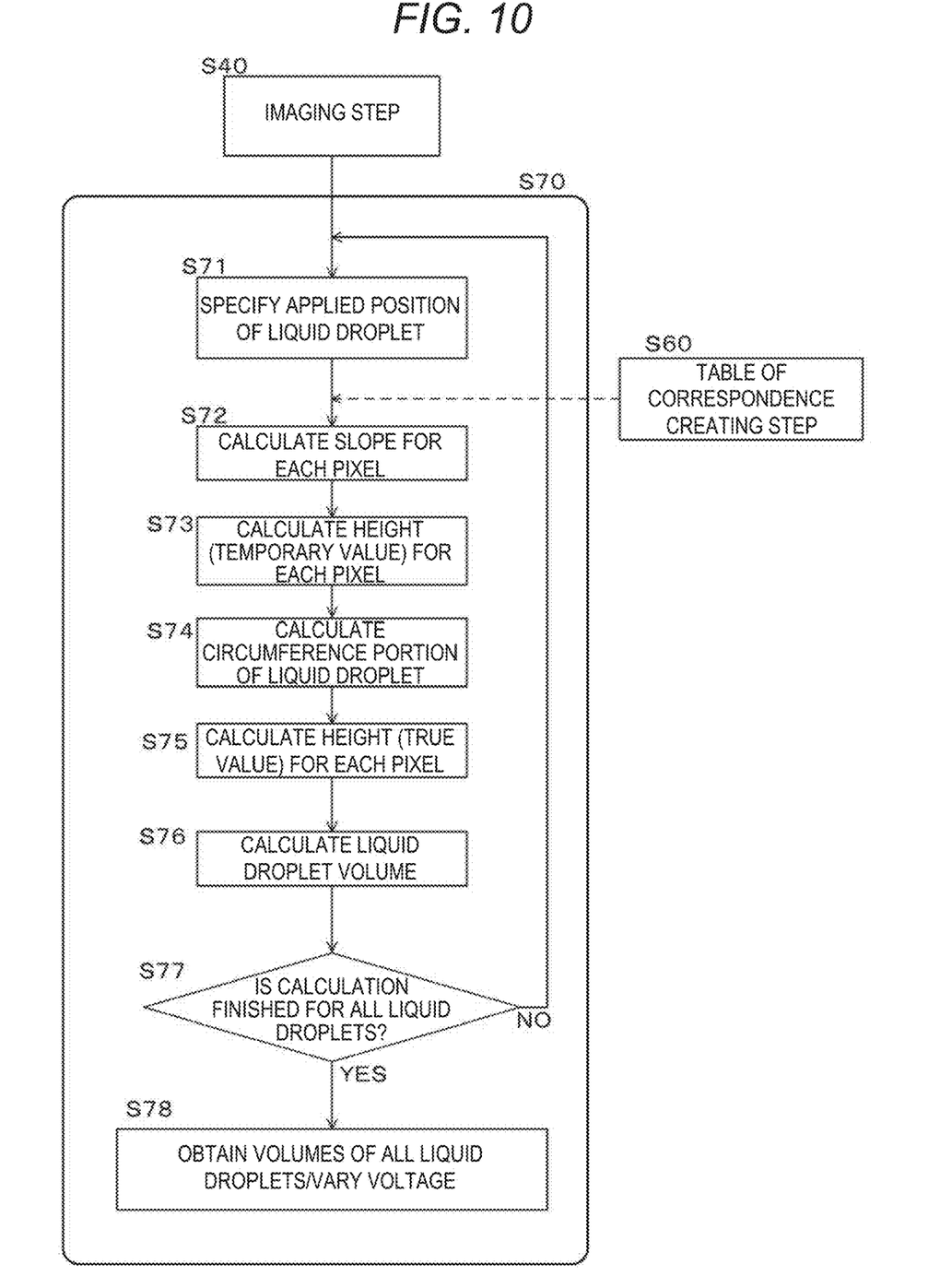
FIG. 10 shows the procedure of the liquid droplet evaluation step.

The following describes the liquid droplet evaluation step S70, the shape measuring step S50, and the table of correspondence creating step S60 in which the image data of liquid droplet obtained in the imaging step S40 (see FIG. 2) is used to calculate the volume or surface shape of each liquid droplet, with reference to FIG. 10.

Before describing the liquid droplet evaluation step S70 represented in FIG. 10, the shape measuring step S50 and the table of correspondence creating step S60 are described first in which a table of correspondence needed to perform the liquid droplet evaluation step S70 is created in advance.

Shape Measuring Step S50

The shape measuring step S50 is a step in which the liquid droplet shape measurement unit 4 measures the shape of a liquid droplet located at a predetermined position from among the plurality of liquid droplets subjected to imaging (evaluation) in the imaging step S40. The liquid droplet shape measurement unit 4 measures the position coordinate data (x, y, z) on the three-dimensional coordinate system (X-Y-Z coordinate system) on the surface of the liquid droplet.

Table of Correspondence Creating Step S60

In the table of correspondence creating step S60, the surface slope of the liquid droplet at a position on the three-dimensional coordinate system is determined from the position coordinate data (x, y, z) based on the profile measured in the shape measuring step S50, and a table of correspondence is created that represents the correspondence between the slope determined and the luminance ratio on a two-dimensional coordinate system in a position corresponding to the position of the measured liquid droplet. (The luminance ratio is determined from the luminance data of liquid droplet obtained in the imaging step S40.) In the present embodiment, the table of correspondence is created in the table of correspondence creating section 26 of the measurement control unit 25. For parallelization of calculation time, the table of correspondence may be created in the table of correspondence creating section 17 of the print control unit 16.

Liquid Droplet Evaluation Step S70

The liquid droplet evaluation step S70 of FIG. 10 is described below.

The liquid droplet evaluation step S70 is performed preferably in the volume calculation section 27 of the measurement control unit 25. However, for parallelization of calculation time, this step may be performed by the volume calculation section 18 of the print control unit 16.

In step S71 of the liquid droplet evaluation step S70, the position of each liquid droplet is specified from the image created in the imaging step S40 for all liquid droplets ejected through all nozzles of interest for evaluation, and a "liquid droplet image" is created by cutting the image for each liquid droplet.

In step S72 of the liquid droplet evaluation step S70, the "liquid droplet image" obtained in step S71 is used to determine the luminance ratio from the luminance information of the image of each liquid droplet, one after another. This is followed by calculations of slopes at all pixel locations for pixels contained in the pixels corresponding to the image of a single liquid droplet, using the table of correspondence.

In step S73 of the liquid droplet evaluation step S70, a Z-direction height (temporary value) is calculated at each pixel location for the image of a single liquid droplet, using the slope information obtained for all pixel locations in step S72.

In step S74 of the liquid droplet evaluation step S70, the luminance information of the image is used to calculate the circumference portion of the liquid droplet.

Thereafter, a circumferential height (temporary value) is calculated using the liquid droplet circumference portion obtained in step S74, and the height (temporary value) determined at all pixel locations in step S73. Preferably, the circumferential height is determined as the average of the heights at pixel locations that fall within a certain range determined from the liquid droplet circumference portion as a distance from the liquid droplet circumference portion toward the center of the liquid droplet.

In step S75 of the liquid droplet evaluation step S70, a height (true value) is calculated for each pixel location. This is carried out by offsetting the height at all pixel locations by subtracting the circumferential height (temporary value) from the height (temporary value) obtained for each pixel location in step S73 so that the circumferential height (temporary value) obtained above becomes zero.

In step S76 of the liquid droplet evaluation step S70, the volume of an individual liquid droplet is determined. Specifically, for a single liquid droplet, the product of the height (true value) determined at each pixel location in step S75, and the area of the pixel corresponding to each pixel location is added for pixel locations that fall inside of the liquid droplet circumference portion determined in step S74.

In step S77 of the liquid droplet evaluation step S70, it is determined whether the liquid droplet volume V was calculated for all liquid droplets. If it is determined that the calculation is not finished, the sequence returns to the point immediately before step S71, and the steps S72 to S76 are repeated. The sequence goes to step S78 if it is determined that the calculations are finished.

In step S78, the amount by which the liquid droplet volume determined differs from the predetermined target volume of a liquid droplet from the nozzle is determined for all the liquid droplets determined in step S76 for the nozzles of interest for evaluation. From the result of the processes in the liquid droplet evaluation step S70, the print control unit 16 of the liquid droplet discharge device 1 is instructed to adjust the applied voltage to the piezoelectric actuator corresponding to each nozzle, and to eject the target volume.

As described above, the liquid droplet measurement device 2 enables a high-speed and accurate measurement of the volume or shape of a liquid droplet ejected by the line head 6 of the liquid droplet discharge device 1, and ensures measurement accuracy. For example, the liquid droplet measurement device 2 enables a high-speed measurement intended to control qualities such as nonuniform colors on a print target, and a high-speed correction of an inkjet device conducted for such purposes.

This is useful in, for example, a liquid droplet ejection printing apparatus that applies and forms an organic light-emitting material for the production of an organic EL display panel.

Second Embodiment

Figure 11:
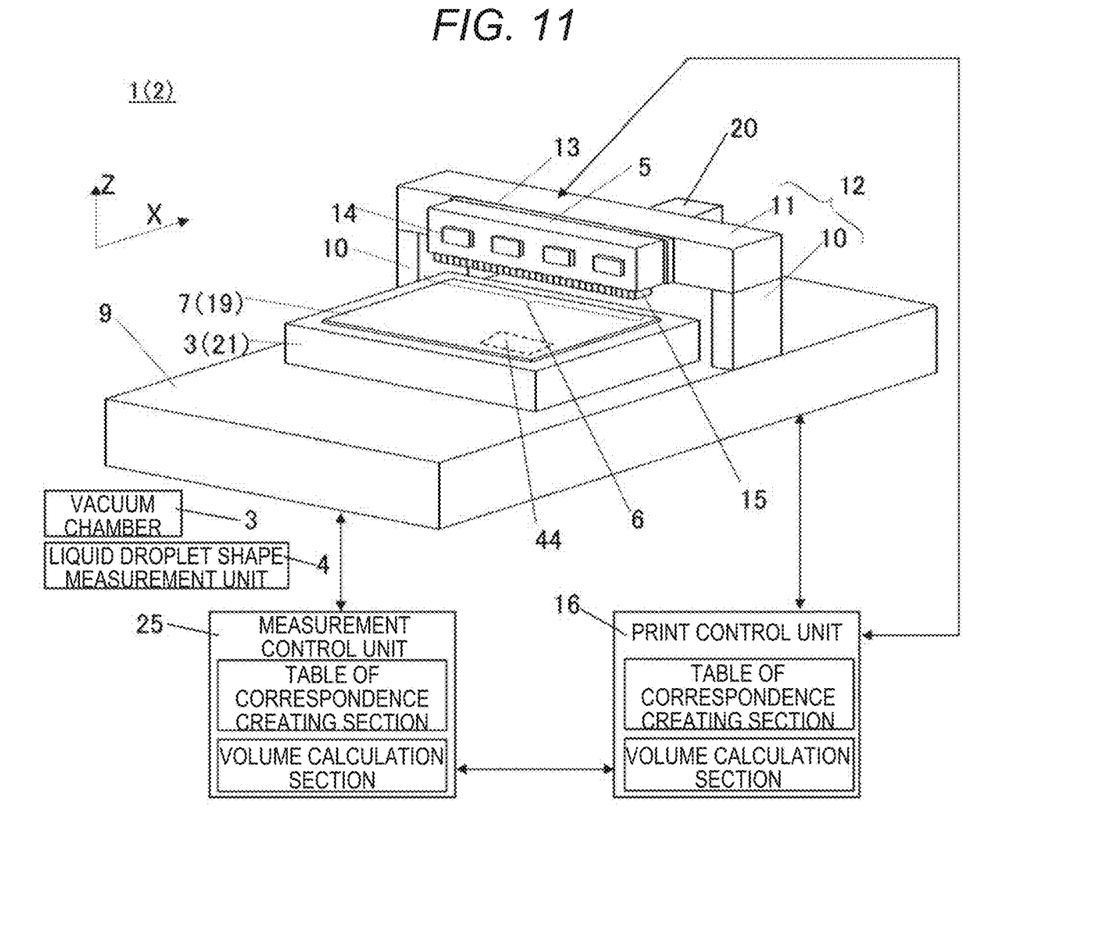
FIG. 11 is a perspective view of a liquid droplet discharge apparatus combining a liquid droplet measurement device and a liquid droplet discharge device.

In First Embodiment, the liquid droplet measurement device 2 is provided separately from the liquid droplet discharge device 1. However, these may be combined, as shown in FIG. 11. FIG. 11 is a perspective view of a liquid droplet discharge apparatus combining the liquid droplet measurement device 2 and the liquid droplet discharge device 1.

The imaging section 20 is provided on the support unit 11 of the liquid droplet discharge device 1. On the work table 8, the recess 44 is formed in the measurement table 21 of the liquid droplet measurement device 2. The luminance information of the sample substrate 19 imaged by the imaging section 20 may be processed as shown in FIG. 2.

In the present embodiment, the liquid droplet ejection module heads 15 are disposed in such an orientation that the longitudinal direction of the liquid droplet ejection module heads 15 is along the sub-scan direction of the stage 9. It is accordingly preferable that the recess 44 be also provided in such an orientation that the longer sides of the recess 44 are along the sub-scan direction of the stage 9.

In this case, a liquid droplet may be formed by being ejected through the line head 6 toward the position of the recess 44 formed on the work table 8. In this way, unlike First Embodiment, it is not required to transport the sample substrate 19 with the liquid droplet to the liquid droplet measurement device 2 and locate and set the sample substrate 19 on the measurement table 21.

This makes it possible to quickly and easily evaluate the line head 6 while producing the print target 7.

Third Embodiment

First Embodiment described using the print target 7 as the sample substrate 19 either directly from the print target 7 produced in the liquid droplet discharge device 1, or after dividing the print target 7. That is, the sample substrate 19 with the printed liquid droplet is set on the measurement table 21 of the liquid droplet measurement device 2 to create a table of correspondence.

However, the line head 6 to be used in the liquid droplet discharge device 1 may be set on the liquid droplet measurement device 2.

Specifically, the sample substrate 19 without a liquid droplet 30 and a dummy liquid droplet 31 is set on the measurement table 21 of the liquid droplet measurement device 2. By using the line head 6 to be used in the liquid droplet discharge device 1, a liquid droplet 30 and a dummy liquid droplet 31 are printed on the sample substrate 19 in positions corresponding to the recess 44 of the measurement table 21 in the liquid droplet measurement device 2. The liquid droplet 30 formed is then imaged by the imaging section 20.

The subsequent processes, including creation of a table of correspondence, are performed in the same manner as in First Embodiment, and the table of correspondence is sent to the print control unit 16 of the liquid droplet discharge device 1. In this way, the ejection amount from each head of the line head 6 can be accurately brought to the target value.

Final Note

First, Second, and Third Embodiments may be combined.

The present disclosure can contribute to improving the performance of a liquid droplet ejection printing apparatus for producing color filters of liquid crystal displays, and devices such as organic EL displays.

What is claimed is:

1. A liquid droplet measurement device comprising:
a measurement table having a surface with a non-concave recess therein and a separate suction passage for holding a translucent sample substrate via suction to suction-fix the translucent sample substrate to the measurement table, the suction passage being spaced from the non-concave recess, wherein
the non-concave recess is formed by walls of the measurement table without openings therein, and
the walls of the measurement table, the non-concave recess and the translucent sample substrate form a sealed space when the translucent sample substrate is suction-fixed to the measurement table;
an imaging section that applies light onto the translucent sample substrate having formed thereon a liquid droplet, and measures quantities of reflected light from the translucent sample substrate and the liquid droplet; and
a measurement control unit that determines a volume or a surface shape of the liquid droplet using luminance information of the reflected light quantities measured by the imaging section,
the translucent sample substrate having a thickness larger than a wavelength of the light, and equal to or smaller than a focal length of the liquid droplet, wherein the translucent sample substrate is arranged on the non-concave recess, and the translucent sample substrate is irradiated with light to measure the amount of reflected light from the translucent sample substrate and the droplet.

2. The liquid droplet measurement device according to claim 1, wherein the focal length of the liquid droplet is a distance at which the incident light on a convex side of the liquid droplet converges in a range having a center at an apex of the liquid droplet.

3. The liquid droplet measurement device according to claim 2, wherein the range is a pixel size derived from a width of a sensor of a camera in the imaging section, and a magnification of a lens in the imaging section.

4. The liquid droplet measurement device according to claim 1, wherein the translucent sample substrate has a refractive index N of $1.4 \leq N \leq 1.6$.

5. The liquid droplet measurement device according to claim 1, wherein a single transparent dummy substrate, or a plurality of transparent dummy substrates of different thicknesses is disposed between the translucent sample substrate and the measurement table.

6. The liquid droplet measurement device according to claim 5, wherein the translucent sample substrate has a surface forming a water-repellent polymer film.

7. An apparatus for manufacturing a device, the apparatus comprising:
the liquid droplet measurement device of claim 1;
a work table for holding a print target; and
a line head for applying a liquid droplet to the print target.

8. The apparatus according to claim 7, which uses the work table as a table for the liquid droplet measurement device.

9. The droplet measuring device according to claim 1, wherein only air is present in the non-concave recess.

10. The droplet measuring device according to claim 1, wherein the non-concave recess is an empty recess in which no other structure exists.

11. A liquid droplet measurement device comprising:
a measurement table having a surface with a non-concave recess therein and a separate suction passage for holding a translucent sample substrate via suction to suction-fix the translucent sample substrate to the measurement table, the suction passage being spaced from the non-concave recess, wherein
an imaging section that applies light onto the translucent sample substrate having formed thereon a liquid droplet above the non-concave recess, and measures quantities of reflected light from the translucent sample substrate and the liquid droplet; and
a measurement control unit that determines a volume or a surface shape of the liquid droplet using luminance information of the reflected light quantities measured by the imaging section,
the translucent sample substrate having a thickness larger than a wavelength of the light, and equal to or smaller than a focal length of the liquid droplet, wherein the translucent sample substrate is arranged on the non-concave recess, and the translucent sample substrate is irradiated with light to measure the amount of reflected light from the translucent sample substrate and the liquid droplet,
wherein a medium in contact with the surface of the liquid droplet and a medium in contact with a rear surface of the translucent sample substrate are both air and have the same refractive index.

12. The droplet measuring device according to claim 11, wherein
the non-concave recess is formed by walls of the measurement table without openings therein, and
the walls of the measurement table, the non-concave recess and the translucent sample substrate form a sealed space when the translucent sample substrate is suction-fixed to the measurement table.

\* \* \* \* \*